US008389306B2

(12) United States Patent
Yu

(10) Patent No.: US 8,389,306 B2
(45) Date of Patent: Mar. 5, 2013

(54) LIGHT EMISSION DEVICE PACKAGE AND METHOD OF FABRICATING THE SAME

(75) Inventor: Dong Hyun Yu, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 169 days.

(21) Appl. No.: 12/956,587

(22) Filed: Nov. 30, 2010

(65) Prior Publication Data
US 2011/0127559 A1 Jun. 2, 2011

(30) Foreign Application Priority Data
Nov. 30, 2009 (KR) .................. 10-2009-0117319

(51) Int. Cl.
*H01L 21/00* (2006.01)
*H01L 23/12* (2006.01)
(52) U.S. Cl. ........................... 438/26; 257/711
(58) Field of Classification Search .............. 438/26–29, 438/64–69; 257/98, 711, E33.001–E33.007
See application file for complete search history.

(56) References Cited

U.S. PATENT DOCUMENTS

| 7,009,284 B2* | 3/2006 | Nakase et al. ............. 257/675 |
| 7,281,816 B2* | 10/2007 | Suzuki ...................... 362/231 |
| 7,948,001 B2 | 5/2011 | Kamada et al. ............ 257/99 |
| 2009/0166664 A1* | 7/2009 | Park et al. ................. 257/99 |
| 2010/0148196 A1 | 6/2010 | Kamada et al. ............ 257/98 |
| 2011/0050074 A1* | 3/2011 | Kim ........................... 313/46 |

FOREIGN PATENT DOCUMENTS

CN 101268561 A 9/2008

* cited by examiner

*Primary Examiner* — Calvin Lee
(74) *Attorney, Agent, or Firm* — Morgan, Lewis & Bockius LLP

(57) ABSTRACT

A light emission device package including a substrate, an opening portion on the substrate, a heat radiation frame on the opening portion, the heat radiation frame protruding from the substrate, a light emission device chip on the heat radiation frame, and a sealant member on the light emission device chip.

22 Claims, 4 Drawing Sheets

LIGHT EMISSION DEVICE PACKAGE AND METHOD OF FABRICATING THE SAME

This application claims the benefit of Korean Patent Application No. 10-2009-0117319 filed on Nov. 30, 2009, which is hereby incorporated by reference.

BACKGROUND OF THE INVENTION

1. Field of the Invention

The present invention relates to a light emission device package and a method of fabricating the same.

2. Discussion of the Related Art

Cathode ray tubes (CRTs) are widely used as a display device. CRTs are used as computer monitors, televisions, displays for measuring apparatuses, information terminals, and so on. However, the heavy weight and large size of CRTs have made the manufacturing of smaller and lighter electronic products more desirable.

To address this matter, LCD devices are gradually being used in a wide range of applications due to their improved luminance, thinness, and power consumption. Furthermore, LCD devices are being manufactured to have even larger screens, be thinner, and consume less power, in order to meet requirements of users. Such LCD devices display images by controlling the amount of light transmitted through liquid crystal.

Unlike CRTs, LCD devices are not self-illuminating display devices. As such, an LCD device includes a backlight unit provided on the rear surface of an LCD panel. The backlight unit includes a separated light source providing the light necessary to display an image. The backlight unit is classified as either an edge type or a direct type backlight in accordance with the disposition of its light source.

The edge type backlight unit includes a light source disposed in a position corresponding to a side of the LCD panel. Also, the edge type backlight unit irradiates light emitted from the light source onto the entire surface of the LCD panel using a light guide panel. On the other hand, the direct type backlight unit includes a plurality of light sources arranged opposite the rear surface of the LCD panel. These plural light sources directly apply light to the rear surface of the LCD panel. The direct type backlight unit has a higher brightness and a wider luminescent surface than the edge type backlight unit because it employs plural light sources.

Recently, as the display size of the LCD device has increased, the size of the backlight unit has also increased. Accordingly, the direct type backlight unit is mainly applied to the enlarged LCD device.

The backlight unit may employ a plasma type light source, such as a cold cathode fluorescent lamp (CCFL), a hot cathode fluorescent lamp (HCFL), an external electrode fluorescent lamp (EEFL), an external and internal electrode fluorescent lamp (EIFL), or others as a light source. Alternatively, the backlight unit may use a light emission device (LED) as a light source. Among these light sources, the LED is widely used in the backlight unit because of its long lifespan, low power consumption, small size, high durability, and other desirable qualities.

LEDs are manufactured in a variety of packages. Among the LED packages, a ceramic LED package has a desirable thermal characteristic. As such, the ceramic LED package has been researched for use as a light source package of the backlight unit. However, a ceramic LED package of the related art is expensive to produce. Also, the ceramic LED package of the related art cannot minimize chromatic variation between light propagation directions (light radiation angles). Furthermore, the ceramic LED package of the related art is limited to a light radiating characteristic (i.e., a narrow light radiation angle or a narrow distribution of radiated light). For these reasons, it is difficult to apply the ceramic LED package to the backlight unit.

In other words, the related art LED package is positioned apart from the optical sheets due to its narrow distribution of radiated light (or its narrow light radiation angle) when it is used as a light source of the backlight unit. As such, the total thickness of the backlight unit is increased. Also, the related art LED package forces the difference (or the variation) between chromatic coordinates in accordance with its light propagation directions to be considerably enlarged. As a result, the related art LED package cannot provide chromatic uniformity to the surface of the backlight unit. Moreover, the related art LED package increases manufacturing costs because it is difficult to manufacture. For example, the manufacturing process includes the treatment of raw materials. Therefore, it is difficult for the related art LED package to apply to the backlight unit.

SUMMARY OF THE INVENTION

Accordingly, the present invention is directed to a light emission device package and method of fabricating the same that substantially obviates one or more problems due to limitations and disadvantages of the related art.

An object of the present invention is to provide an LED package that is adapted to minimize the deviation between chromatic coordinates in accordance with different light propagation directions Another object of the present invention is to provide an LED package that is adapted to expand a radiation distribution of light (or to enlarge a light radiation angle range) by forming a uniform fluorescent layer, and a method of manufacturing the same.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the light emission device package and method of fabricating the same includes a light emission device package including a substrate, an opening portion on the substrate, a heat radiation frame on the opening portion, the heat radiation frame protruding from the substrate, a light emission device chip on the heat radiation frame, and a sealant member on the light emission device chip.

In another aspect, the light emission device package and method of fabricating the same includes a method of fabricating a light emission device package, including the steps of forming a substrate, forming an opening portion on the substrate, forming a heat radiation frame on the opening portion, the heat radiation frame protruding from the substrate, attaching a light emission device chip on the heat radiation frame, and forming a sealant member on the light emission device chip.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EXEMPLARY EMBODIMENTS

Reference will now be made in detail to the embodiments of the present invention, examples of which are illustrated in the accompanying drawings.

Figure 1:
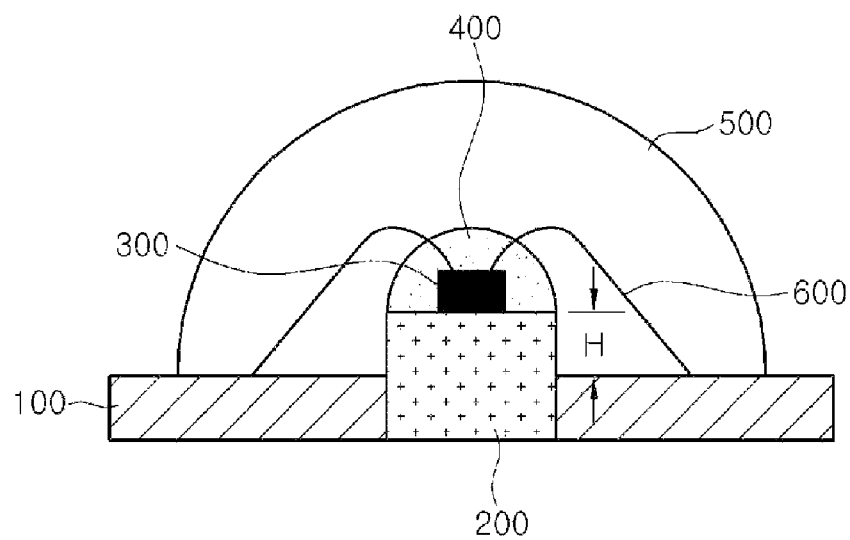
FIG. 1 is a cross-sectional view showing an LED package according to an exemplary embodiment of the present invention.

FIG. 1 is a cross-sectional view showing an LED package according to an exemplary embodiment of the present invention. FIGS. 2 through 7 are cross-sectional views illustrating a fabricating method of the LED package according to another exemplary embodiment of the present invention.

As shown in FIG. 1, the LED package according to an embodiment of the present invention includes a substrate 100 with a through hole 210 formed to penetrate through the substrate 100, and a heat radiation frame 200 inserted into the through hole 210 and formed to protrude higher than an upper surface of the substrate 100. The LED package further includes an LED chip 300 disposed on the heat radiation frame 200, and a sealant member 400 formed to encompass the LED chip 300 and to contain a fluorescent particles (not shown).

The substrate 100 is formed from a material having a preferable thermal conductivity and a high thermal expansion coefficient. The thermal conductivity and thermal expansion coefficient of the substrate material can have similar values to those of a material which is used to form the LED chip 300. For example, a ceramic substrate can be used as a substrate 100. The LED package configured to include the ceramic substrate may have desirable thermal characteristics. Also, the LED package is rarely damaged by ultraviolet rays from a blue chip because of its structure using a ceramic material.

The heat radiation frame 200 is formed into the through hole 210 penetrating through the substrate 100. The heat radiation frame 200 can be formed from silver Ag (or other metal material) and in a columnar shape. In this case, the diameter of the heat radiation frame 200 may be at least 0.4 mm. Alternatively, the heat radiation frame 200 can be formed in a polygonal-pillar shape. For example, the heat radiation frame 200 can be formed in the shape of a four-cornered pillar. Also, the heat radiation frame 200 is formed to protrude higher than the upper surface of the substrate 100. In detail, the heat radiation frame 200 may be formed to protrude at least 10 microns above the upper surface of the substrate 100.

The LED chip 300 is attached to the upper surface of the protruded heat radiation frame 200. The sealant member 400 configured to include the fluorescent particles is formed on the upper surface of the protruded heat radiation frame 200 in such a manner as to the LED chip 300. When the sealant member 400 is formed, a seal material containing the fluorescent particles exists only in the upper surface of the heat radiation frame 200 without spreading to the upper surface of the substrate 100 due to its surface tension. The area of the sealant member 400 provided with the fluorescent particles becomes similar to an area of the LED chip 300. As such, the sealant member 300 allows for a fluorescent layer to have a uniform structure. Therefore, the LED package can minimize deviation between chromatic coordinates for the light propagation directions.

Also, the LED package can minimize the size of a white light emission area because the area of the sealant member 400 with the fluorescent particles is similar to the area of the LED chip 300. Therefore, the LED package of a lens type can have a wide radiation distribution and be applied to a direct type backlight unit. As a result, the LED package can reduce the total thickness of a backlight unit.

Meanwhile, the related art LED package is expensive because it includes a ceramic reflection plate formed on a ceramic substrate. However, since the LED package according to the present invention includes the heat radiation frame 200 formed to protrude higher than the upper surface of the substrate 100, the ceramic reflection plate can be removed from the LED package of the present invention. Therefore, the LED package of the present invention can reduce the fabricating costs to less than half that of the related art LED package.

The sealant member 400 can be formed in a hemisphere shape, but it is not limited to this. Also, the sealant member 400 can be formed on the LED chip 300 and the heat radiation frame 200. As such, the fluorescent layer of a uniform structure as described above can be implemented. Moreover, the sealant member 400 can be formed from an epoxy-based or a silicon-based material, but it is not limited to this. Furthermore, the sealant member can be formed to have a height of at least 100 microns.

The LED package of the present invention further includes wires 600 connected to the LED chip 300 and lead frames (not shown) and is configured to form an electric current path of the LED chip. A lens 500 is configured to improve the light emission efficiency of the LED package and to protect the sealant member 400 and the wires 600. The wires can be formed from one material selected from a group which includes gold Au, cooper Cu, aluminum Al, and others. The lens 500 can be formed in a hemisphere shape. Also, the lens 500 can be formed from either the same material as the sealant member 400 or a different material from the sealant member 400. Although the lens 500 does not usually include fluorescent particles unlike the sealant member 400, the lens 500 may also include fluorescent particles or a fluorescer.

A fabricating method of the LED package according to another exemplary embodiment of the present invention will now be explained in detail with reference to FIGS. 2 through 7.

Figure 2:
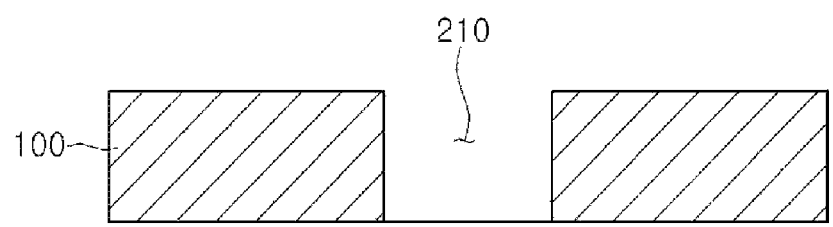
FIGS. 2 through 7 are cross-sectional views illustrating a fabricating method of the LED package according to another exemplary embodiment of the present invention.

As shown in FIG. 2, a substrate 100 is prepared and then a through hole 210 is formed in the substrate 100 by punching the through hole 210 through the substrate 100. The substrate 100 is formed from a material with a high thermal expansion coefficient and superior thermal conductivity. For example, the substrate 100 included in the LED package can be formed from a ceramic material.

Figure 3:
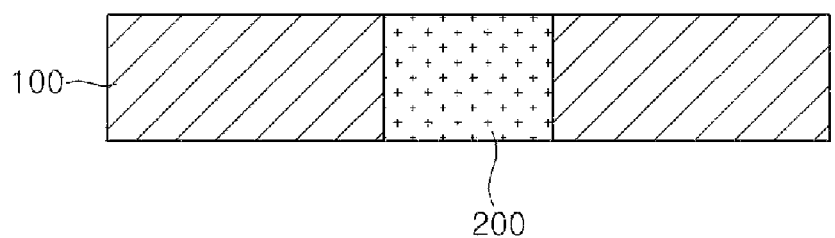

As shown in FIG. 3, a heat radiation frame 200 is formed into the through hole 210 by filling the through hole 210 with a heat radiation material. The heat radiation frame 200 can be formed from silver Ag (or other metal material). The heat radiation frame 200 is protruded higher than an upper surface of the substrate 100 through one of processes which are illustrated in FIGS. 4A and 4B.

Figure 4A:
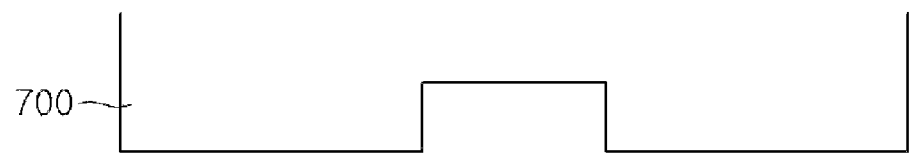
Figure 4A:
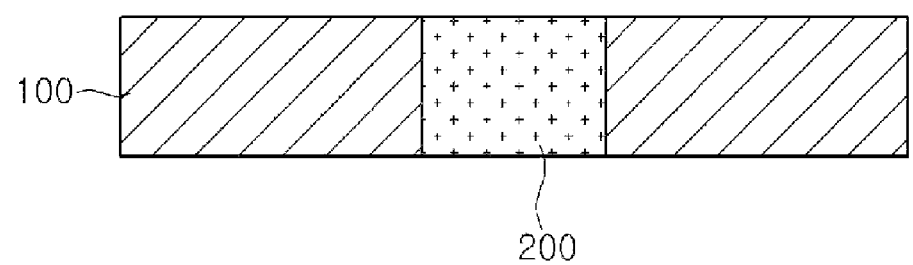
Figure 5:
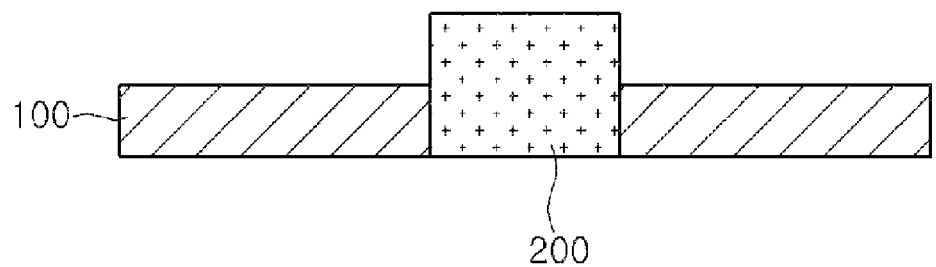

As shown in FIG. 4A, the entire upper surface of the substrate 100 without the heat radiation frame 200 can be depressed by a presser 700 so that the upper surface of the substrate 100 becomes lower than that of the heat radiation frame 200. In other words, the heat radiation frame 200 is protruded higher than the upper surface of the substrate 100, as shown in FIG. 5.

Figure 4B:
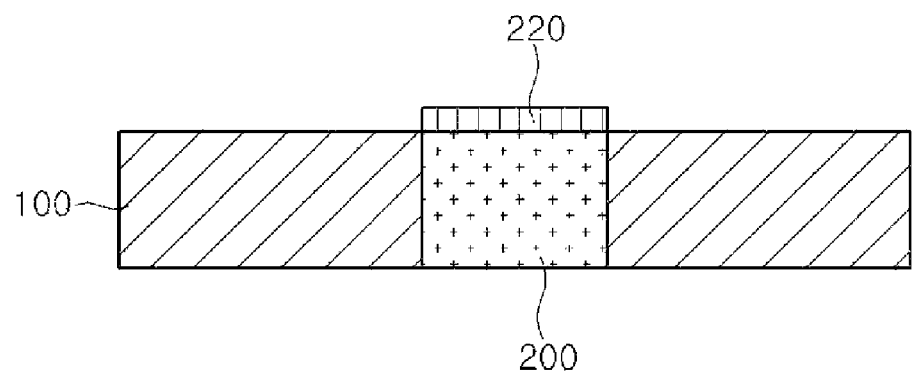

On the other hand, a mask pattern 220 can be formed on the heat radiation frame 200 as shown in FIG. 4B. Then, the substrate 100 can be etched using the mask pattern 220 as an etching mask. In accordance therewith, the heat radiation frame 200 can be protruded higher than the upper surface of the substrate 100, as shown in FIG. 5.

In this case, the heat radiation frame 200 is highly protruded from the upper surface of the substrate 100 by a fixed height H. The fixed height may be at least 10 microns. The heat radiation frame 200 protruded higher than the substrate 100 allows a sealant material containing fluorescent particles to stay only on the upper surface of the heat radiation frame 200 without spreading to the upper surface of the substrate 100 by its surface expansion tension. As such, a sealant member configured to include the fluorescent particles can be formed in a size similar to that of a LED chip 300.

Such a sealant member 300 allows for a fluorescent layer to have a uniform structure. Therefore, the LED package can minimize deviation between chromatic coordinates for the light progression directions.

Also, the LED package can minimize the size of a white light emission area because the area of the sealant member 400 with the fluorescent particles is similar to the area of the LED chip 300. Therefore, the LED package of a lens type can have a wide radiation distribution and be applied to a direct type backlight unit. As a result, the LED package can reduce the total thickness of a backlight unit.

Meanwhile, the related art LED package is expensive because it includes a ceramic reflection plate formed on a ceramic substrate. However, the LED package according to the present invention does not require the ceramic reflection plate included in the related art LED package. Therefore, the LED package of the present invention reduces the fabricating costs by half as compared to the related art LED package.

Figure 6:
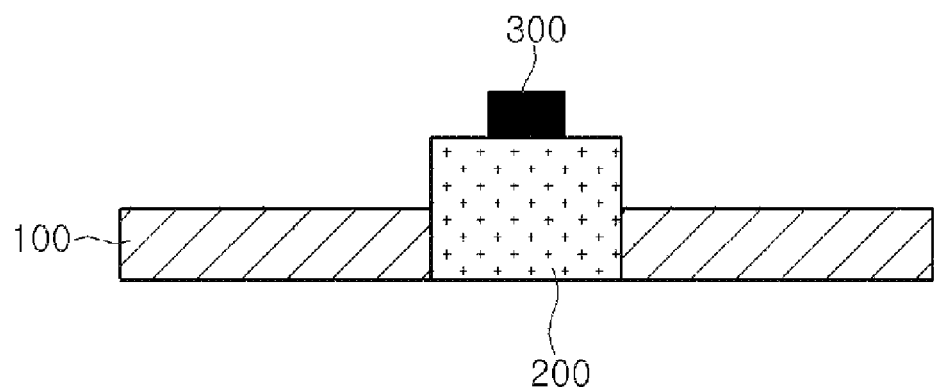

As shown in FIG. 6, an LED chip 300 is attached to the upper surface of the heat radiation frame 200. More specifically, the LED chip 300 can be attached to the heat radiation frame 200 using an epoxy-based adhesive or a silicon-based adhesive. If it is necessary for the adhesive material to have a high thermal conductivity, electrically conductive silver-filled epoxy can be used to attach the LED chip 300 to the heat radiation frame 200. Also, either a flip-chip bonding method using a solder or a eutectic die bonding method can be applied to bond the LED chip 300 to the heat radiation frame 200. However, the bonding of the LED chip and the heat radiation frame 200 is not limited to the above bonding methods.

Subsequently, wires 600 are connected between the LED chip 300 and lead frames (not shown). The wires are used to form an electric current path of the LED chip 300. Such wires can be formed from one material selected from a material group which includes gold Au, cooper Cu, aluminum Al, and others.

Figure 7:
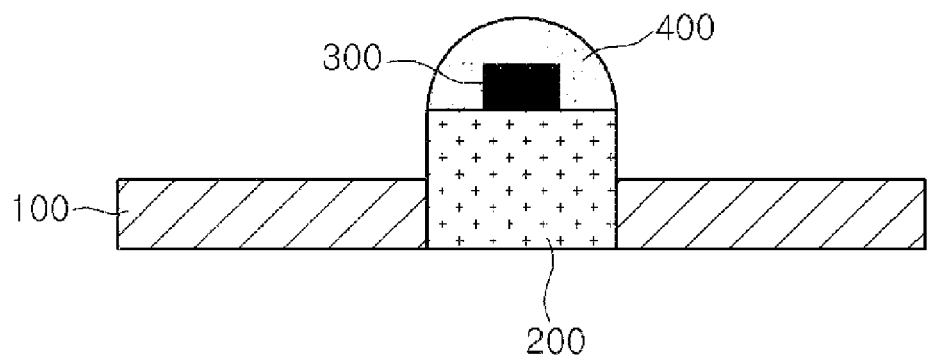

Thereafter, a sealant member 400 configured to include fluorescent particles (or a fluorescer) is formed on the heat radiation frame 200 in such a manner as to encompass the LED chip 300, as shown in FIG. 7. The sealant member 400 with the fluorescent particles (or the fluorescer) functions to protect the LED chip 300 and to improve the light emission efficiency of the LED package. Also, the sealant member 400 can be formed in a hemisphere shape. Furthermore, the sealant member 400 can be formed from either an epoxy-based material or a silicon-based material, but it is not limited to this. Such a sealant member 400 makes it possible for a fluorescent layer structure to have a uniform thickness for the entire light radiation directions of the LED chip 300. In a different manner, the sealant member 400 can be formed only on the LED chip 300.

Finally, a lens 500 is formed above the sealant member 300, thereby providing an LED package with a cross-section structure shown in FIG. 1. The lens 500 can be formed in a hemisphere shape. Also, the lens 500 can be formed from either the same material as the sealant member 400 or a different material from the sealant member 400. Although the lens 500 does not usually include fluorescent particles unlike the sealant member 400, the lens 500 may also include fluorescent particles or a fluorescer. The lens 500 functions to protect the wires 600 and the sealant member 400 and to improve light emission efficiency.

Figure 8:
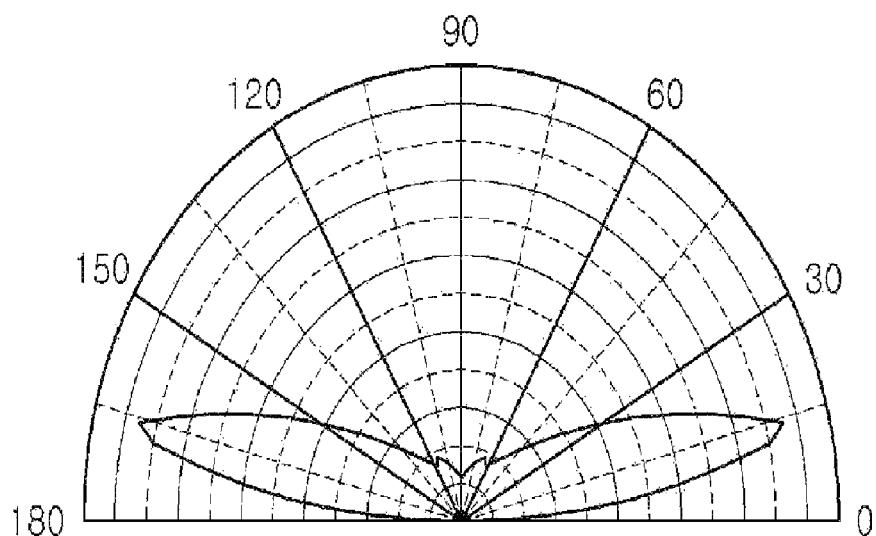
FIG. 8 is a data sheet illustrating an exemplary distribution of light which is radiated from an LED package shown in FIG. 1.
Figure 9:
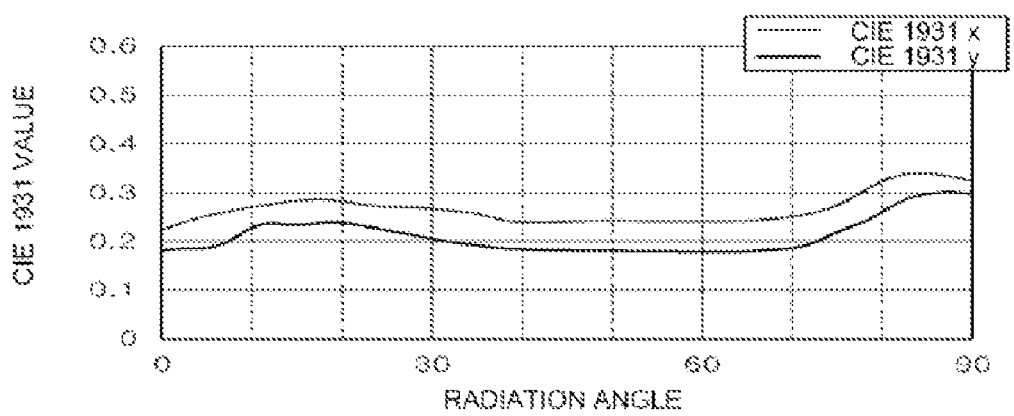
FIG. 9 is a data sheet illustrating an exemplary variation of a specified chromatic coordinate in accordance with the radiant directions of an LED package shown in FIG. 1.

FIG. 8 is a data sheet illustrating a distribution of light which is radiated from an LED package shown in FIG. 1. FIG. 9 is a data sheet illustrating the variation of a specified chromatic coordinate in accordance with the radiant directions of an LED package shown in FIG. 1.

As seen from FIG. 8, the LED package of the present invention has a wide light radiation distribution. This results from the fact that the LED package of the present invention minimizes the size of a white emission domain. As such, a direct type backlight unit configured to include the LED package of the present invention can become thinner.

As shown in FIG. 9, the variation width of a specified chromatic coordinate in accordance with the radiation directions of the LED package of the present invention is reduced. This results from the fact that the LED package of the present invention allows a fluorescent layer structure with a uniform thickness in the entire radiation directions to be implemented.

It will be apparent to those skilled in the art that various modifications and variations can be made in the light emission device package and method of fabricating the same of the present invention without departing from the spirit or scope of the invention. Thus, it is intended that the present invention cover the modifications and variations of this invention provided they come within the scope of the appended claims and their equivalents.

What is claimed is:

1. A method of fabricating a light emission device package, comprising the steps of:
   forming a substrate;
   forming an opening portion on the substrate;
   forming a heat radiation frame on the opening portion, the heat radiation frame protruding from the substrate;
   attaching a light emission device chip on the heat radiation frame; and
   forming a sealant member on the light emission device chip.

2. The method of fabricating a light emission device package according to claim 1, wherein a protrusion of the heat radiation frame is formed by:
   forming a mask pattern on the heat radiation frame; and
   etching a portion of the substrate.

3. The method of fabricating a light emission device package according to claim 1, wherein a protrusion of the heat radiation frame is formed by pressing a portion of the substrate not including the heat radiation frame.

4. The method of fabricating a light emission device package according to claim 1, wherein the heat radiation frame is formed to protrude from the surface of the substrate by at least 10 microns.

5. The method of fabricating a light emission device package according to claim 1, wherein the sealant member is formed in a hemisphere shape.

6. The method of fabricating a light emission device package according to claim 1, wherein the opening portion is a through hole or a recess portion.

7. The method of fabricating a light emission device package according to claim 1, wherein the sealant member includes fluorescent particles or a fluorescer.

8. The method of fabricating a light emission device package according to claim 1, further comprising the step of forming a lens on the substrate.

9. The method of fabricating a light emission device package according to claim 8, wherein the lens includes fluorescent particles or a fluorescer.

10. The method of fabricating a light emission device package according to claim 1, wherein the substrate is formed from a ceramic material.

11. The method of fabricating a light emission device package according to claim 1, wherein the heat radiation frame is formed from silver Ag.

12. The method of fabricating a light emission device package according to claim 1, wherein the width of the heat radiation frame is at least 0.4 mm.

13. A light emission device package comprising:
a substrate;
an opening portion on the substrate;
a heat radiation frame on the opening portion, the heat radiation frame protruding from the substrate;
a light emission device chip on the heat radiation frame; and
a sealant member on the light emission device chip.

14. The light emission device package according to claim 13, wherein the opening portion is a through hole or a recess portion.

15. The light emission device package according to claim 13, wherein the sealant member includes fluorescent particles or a fluorescer.

16. The light emission device package according to claim 13, further comprising a lens on the substrate.

17. The light emission device package according to claim 16, wherein the lens includes fluorescent particles or a fluorescer.

18. The light emission device package according to claim 13, wherein the substrate is formed from a ceramic material.

19. The light emission device package according to claim 13, wherein the heat radiation frame is formed from silver Ag.

20. The light emission device package according to claim 13, wherein the heat radiation frame protrudes from the surface of the substrate by at least 10 microns.

21. The light emission device package according to claim 13, wherein the sealant member is formed in a hemisphere shape.

22. The light emission device package according to claim 13, wherein the width of the heat radiation frame is at least 0.4 mm.

* * * * *